United States Patent
Henley et al.

(12) 
(10) Patent No.: US 6,291,326 B1
(45) Date of Patent: Sep. 18, 2001

(54) PRE-SEMICONDUCTOR PROCESS IMPLANT AND POST-PROCESS FILM SEPARATION

(75) Inventors: Francois J. Henley, Los Gatos; Nathan W. Cheung, Albany, both of CA (US)

(73) Assignee: Silicon Genesis Corporation, Campbell, CA (US)

( * ) Notice: Subject to any disclaimer, the term of this patent is extended or adjusted under 35 U.S.C. 154(b) by 0 days.

(21) Appl. No.: 09/335,222

(22) Filed: Jun. 17, 1999

Related U.S. Application Data

(60) Provisional application No. 60/090,387, filed on Jun. 23, 1998.

(51) Int. Cl.⁷ .................................................. H01L 21/425
(52) U.S. Cl. ........................................... 438/526; 438/460
(58) Field of Search ...................... 438/455, 456, 438/458, 459, 460, 510, 514, 526, 315, 800, 690

(56) References Cited

U.S. PATENT DOCUMENTS

| | | |
|---|---|---|
| 2,614,055 | 10/1952 | Senarelens . |
| 3,117,022 | 1/1964 | Bronson et al. . |
| 3,225,820 | 12/1965 | Riordan . |
| 3,551,213 | 12/1970 | Boyle . |
| 3,770,499 | 10/1973 | Crowe et al. . |

(List continued on next page.)

FOREIGN PATENT DOCUMENTS

| | | |
|---|---|---|
| 834363 | 3/1952 | (DE) . |
| 084 287 | 7/1983 | (EP) . |
| 099 778 | 2/1984 | (EP) . |
| 155 875 | 2/1984 | (EP) . |
| 112 230 | 6/1984 | (EP) . |
| 112 238 | 6/1984 | (EP) . |
| 164 281 | 12/1985 | (EP) . |
| 181 249 | 5/1986 | (EP) . |
| 379 828 | 1/1989 | (EP) . |
| 355 913 | 2/1990 | (EP) . |

(List continued on next page.)

OTHER PUBLICATIONS

Alles, Michael et al., "Thin Film Silicon on Insulator: An Enabling Technology," *Semiconductor International*, pp. 67–72 (1997).

Basta, Nicholas, "Ion–Beam Implantation," *High Technology*, (1985).

Burggraff, Peter, "Advanced Plasma Source: What's Working?" *Semiconductor International*, pp. 56–59 (May 1994).

Carter, G. et al., "The Collection of Ions Implanted in Semiconductors," *Radiation Effects*, 16(1–2):107–114 (1972).

Cassidy, Victor M., "Ion Implantation Process Toughens Metalworking Tools," *Modern Metals*, pp. 65–67 (1984).

(List continued on next page.)

*Primary Examiner*—David Nelms
*Assistant Examiner*—Dung Anh Le
(74) *Attorney, Agent, or Firm*—Townsend and Townsend and Crew LLP

(57) ABSTRACT

A multilayered substrate. The substrate has a plurality of particles defined in a pattern in the substrate at a selected depth underneath the surface of the substrate. The particles are at a concentration at the selected depth to define a substrate material to be removed above the selected depth. The substrate material is removed after forming active devices on the substrate material using, for example, conventional semiconductor processing techniques. The pattern is defined in a manner to substantially prevent a possibility of detachment of the substrate material to be removed during conventional thermal processes of greater than about room temperature or greater than about 200 degrees Celsius.

23 Claims, 10 Drawing Sheets

U.S. PATENT DOCUMENTS

| | | |
|---|---|---|
| 3,786,359 | 1/1974 | King . |
| 3,806,380 | 4/1974 | Kitada et al. . |
| 3,832,219 | 8/1974 | Nelson et al. . |
| 3,900,636 | 8/1975 | Curry et al. . |
| 3,901,423 | 8/1975 | Hillberry et al. . |
| 3,915,757 | 10/1975 | Engel . |
| 3,957,107 | 5/1976 | Altoz et al. . |
| 3,993,909 | 11/1976 | Drews et al. . |
| 4,006,340 | 2/1977 | Gorinas . |
| 4,039,416 | 8/1977 | White . |
| 4,074,139 | 2/1978 | Pankove . |
| 4,107,350 | 8/1978 | Berg et al. . |
| 4,108,751 | 8/1978 | King . |
| 4,116,751 | 9/1978 | Zaromb . |
| 4,121,334 | 10/1978 | Wallis . |
| 4,170,662 | 10/1979 | Weiss et al. . |
| 4,244,348 | 1/1981 | Wilkes . |
| 4,252,837 | 2/1981 | Auton . |
| 4,274,004 | 6/1981 | Kanai . |
| 4,342,631 | 8/1982 | White et al. . |
| 4,346,123 | 8/1982 | Kaufmann . |
| 4,361,600 | 11/1982 | Brown . |
| 4,368,083 | 1/1983 | Bruel et al. . |
| 4,412,868 | 11/1983 | Brown et al. . |
| 4,452,644 | 6/1984 | Bruel et al. . |
| 4,468,309 | 8/1984 | White . |
| 4,471,003 | 9/1984 | Cann . |
| 4,486,247 | 12/1984 | Ecer et al. . |
| 4,490,190 | 12/1984 | Speri . |
| 4,500,563 | 2/1985 | Ellenberger et al. . |
| 4,508,056 | 4/1985 | Bruel et al. . |
| 4,536,657 | 8/1985 | Bruel . |
| 4,539,050 | 9/1985 | Kramler et al. . |
| 4,566,403 | 1/1986 | Fournier . |
| 4,567,505 | 1/1986 | Pease et al. . |
| 4,568,563 | 2/1986 | Jackson et al. . |
| 4,585,945 | 4/1986 | Bruel et al. . |
| 4,684,535 | 8/1987 | Heinecke et al. . |
| 4,704,302 | 11/1987 | Bruel et al. . |
| 4,717,683 | 1/1988 | Parrillo et al. . |
| 4,727,047 | 2/1988 | Bozler et al. . |
| 4,764,394 | 8/1988 | Conrad . |
| 4,837,172 | 6/1989 | Mizuno et al. . |
| 4,846,928 | 7/1989 | Dolins et al. . |
| 4,847,792 | 7/1989 | Barna et al. . |
| 4,853,250 | 8/1989 | Boulos et al. . |
| 4,883,561 | 11/1989 | Gmitter et al. . |
| 4,887,005 | 12/1989 | Rough et al. . |
| 4,894,709 | 1/1990 | Phillips et al. . |
| 4,931,405 | 6/1990 | Kamijo et al. . |
| 4,948,458 | 8/1990 | Ogle . |
| 4,952,273 | 8/1990 | Popov . |
| 4,960,073 | 10/1990 | Suzuki et al. . |
| 4,982,090 | 1/1991 | Wittmaack . |
| 4,996,077 | 2/1991 | Moslehi et al. . |
| 5,015,353 | 5/1991 | Hubler et al. . |
| 5,034,343 | 7/1991 | Rouse et al. . |
| 5,070,040 | 12/1991 | Pankove . |
| 5,082,793 | 1/1992 | Li . |
| 5,110,748 | 5/1992 | Sarma . |
| 5,133,826 | 7/1992 | Dandl . |
| 5,196,355 | 3/1993 | Wittkower . |
| 5,198,371 | 3/1993 | Li . |
| 5,202,095 | 4/1993 | Houchin et al. . |
| 5,203,960 | 4/1993 | Dandl . |
| 5,206,749 | 4/1993 | Zavracky et al. . |
| 5,213,451 | 5/1993 | Frank . |
| 5,234,529 | 8/1993 | Johnson . |
| 5,234,535 | 8/1993 | Beyer et al. . |
| 5,242,861 | 9/1993 | Inaba . |
| 5,250,328 | 10/1993 | Otto . |
| 5,252,178 | 10/1993 | Moslehi . |
| 5,256,562 | 10/1993 | Vu et al. . |
| 5,258,320 | 11/1993 | Zavracky et al. . |
| 5,258,325 | 11/1993 | Spitzer et al. . |
| 5,269,880 | 12/1993 | Jolly et al. . |
| 5,273,610 | 12/1993 | Thomas, III et al. . |
| 5,304,509 | 4/1994 | Sopori . |
| 5,317,236 | 5/1994 | Zavracky et al. . |
| 5,342,472 | 8/1994 | Imahashi et al. . |
| 5,354,381 | 10/1994 | Sheng . |
| 5,362,671 | 11/1994 | Zavracky et al. . |
| 5,363,603 | 11/1994 | Miller et al. . |
| 5,368,710 | 11/1994 | Chen et al. . |
| 5,370,765 | 12/1994 | Dandl . |
| 5,374,564 | 12/1994 | Bruel . |
| 5,376,560 | 12/1994 | Aronowitz et al. . |
| 5,377,031 | 12/1994 | Vu et al. . |
| 5,404,079 | 4/1995 | Ohkuni et al. . |
| 5,405,480 | 4/1995 | Benzing et al. . |
| 5,411,592 | 5/1995 | Ovshinsky et al. . |
| 5,435,880 | 7/1995 | Minato et al. . |
| 5,438,241 | 8/1995 | Zavracky et al. . |
| 5,444,557 | 8/1995 | Spitzer et al. . |
| 5,475,514 | 12/1995 | Salerno et al. . |
| 5,476,691 | 12/1995 | Komvopoulos et al. . |
| 5,487,785 | 1/1996 | Horiike et al. . |
| 5,494,835 | 2/1996 | Bruel . |
| 5,504,328 | 4/1996 | Bonser . |
| 5,528,397 | 6/1996 | Zavracky et al. . |
| 5,558,718 | 9/1996 | Leung . |
| 5,559,043 | 9/1996 | Bruel . |
| 5,581,385 | 12/1996 | Spitzer et al. . |
| 5,585,304 | 12/1996 | Hayashi et al. . |
| 5,611,855 | 3/1997 | Wijaranakula . |
| 5,643,834 | 7/1997 | Harada et al. . |
| 5,653,811 | 8/1997 | Chan . |
| 5,705,421 | 1/1998 | Matsushita et al. . |
| 5,710,057 | 1/1998 | Kenney . |
| 5,714,395 | 2/1998 | Bruel . |
| 5,755,914 | 5/1998 | Yonehara . |
| 5,804,086 | 9/1998 | Bruel . |
| 5,854,123 | 12/1998 | Sato et al. . |
| 5,869,387 | 2/1999 | Sato et al. . |
| 5,877,070 | 3/1999 | Goesele et al. . |
| 5,882,987 | 3/1999 | Srikrishnan . |
| 5,920,764 | 7/1999 | Hanson et al. . |
| 5,953,622 | 9/1999 | Lee et al. . |
| 5,966,620 | 10/1999 | Sakaguchi et al. . |
| 6,033,974 | * 3/2000 | Henry et al. .................. 438/526 |

FOREIGN PATENT DOCUMENTS

| | | |
|---|---|---|
| 459 177 | 12/1991 | (EP) . |
| 504 714 | 9/1992 | (EP) . |
| 533 551 | 3/1993 | (EP) . |
| 660 140 | 6/1995 | (EP) . |
| 665 587 | 8/1995 | (EP) . |
| 665 588 | 8/1995 | (EP) . |
| 703 609 | 3/1996 | (EP) . |
| 763 849 | 3/1997 | (EP) . |
| 867 917 | 3/1998 | (EP) . |
| 867 921 | 3/1998 | (EP) . |
| 1558881 | 1/1969 | (FR) . |
| 2261802 | 2/1974 | (FR) . |
| 2235474 | 4/1974 | (FR) . |
| 2298880 | 1/1975 | (FR) . |
| 2266304 | 4/1975 | (FR) . |
| 2519437 | 1/1982 | (FR) . |
| 2529383 | 6/1982 | (FR) . |
| 2537768 | 8/1982 | (FR) . |
| 2537777 | 12/1982 | (FR) . |

| | | |
|---|---|---|
| 2715502 | 1/1984 | (FR) . |
| 2560426 | 2/1984 | (FR) . |
| 2563377 | 4/1984 | (FR) . |
| 2575601 | 12/1984 | (FR) . |
| 2681472 | 9/1991 | (FR) . |
| 2714524 | 12/1993 | (FR) . |
| 2715501 | 1/1994 | (FR) . |
| 2715503 | 1/1994 | (FR) . |
| 2720189 | 5/1994 | (FR) . |
| 2725074 | 9/1994 | (FR) . |
| 2211991 | 7/1989 | (GB) . |
| 60-235434 | 11/1958 | (JP) . |
| 53-104156 | 9/1978 | (JP) . |
| 58-144475 | 8/1983 | (JP) . |
| 60-83591 | 10/1983 | (JP) . |
| 59-19394 | 1/1984 | (JP) . |
| 59-46750 | 3/1984 | (JP) . |
| 59-54217A | 3/1984 | (JP) . |
| 59-114744 | 7/1984 | (JP) . |
| 59-139539 | 8/1984 | (JP) . |
| 60-207237 | 10/1985 | (JP) . |
| 4-76503 | 7/1990 | (JP) . |
| 2901031 | 1/1992 | (JP) . |
| 2910001 | 1/1992 | (JP) . |
| 4-246594 | 9/1992 | (JP) . |
| 5-211128 | 8/1993 | (JP) . |
| 7-215800 | 8/1995 | (JP) . |
| 7-254690 | 10/1995 | (JP) . |
| 7-263291 | 10/1995 | (JP) . |
| 8-97389 | 4/1996 | (JP) . |
| 11-045840 | 2/1999 | (JP) . |
| WO 95/10718 | 4/1995 | (WO) . |
| WO 95/20824 | 8/1995 | (WO) . |
| WO 95/31825 | 11/1995 | (WO) . |
| WO 99/35674 | 7/1999 | (WO) . |

OTHER PUBLICATIONS

Cheung, N.W., "Plasma Immersion Ion Implanation for Semiconductor Processing," *Material Chemistry and Physics*, 46(2–3): 132–139 (1996).

Choyke et al., "Mechanical Response of Single Crystal Si to Very High Fluence H+ Implantation," *Nuc. Instr. Meth.*, 209–210:407–412 (1983).

Choyke et al., "Implanted Hydrogen Effects at High Concentrations in Model Low Z Shielding Materials," *J. Nuc. Mtrls.*, 122–23:1585–86 (1984).

Choyke et al., "A Comparative Study of Near–Surface Effects Due to Very High Fluence H+ Implantation in Single Crystal FZ, CZ, and Web SI," *Mat. Res. Soc. Symp. Proc.*, 27:359–364 (1984).

Chu, P.K. et al. "Plasma Immersion Ion Implantation—A Fledgling Technique for Semiconductor Processing," *Materials Science and Engineering Reports: A Review Journal*, R17(6–7): 207–280 (1996) cover page and table of contents only.

Chu, Paul K. et al., "Recent Applications of Plasma Immersion Ion Implantation," *Semiconductor International*, pp. 165–172 (1996).

Chu, Paul K., "Synthesis of SOI Materials Using Plasma Immersion Ion Implantation," *1997 Mat. Res. Soc. Symp. Proc.*, 438:333–343 (1997).

Corbett et al., "Embrittlement of Materials: Si(H) as a Model System," *J. Nuc. Mtrls.*, 169: 179–184 (1989).

Hulett, D.M. et al., "Ion Nitriding and Ion Implantation: A Comparison," *Metal Progress*, pp. 18–21 (1985).

I.B.M. Technical Disclosure Bulletin, vol. 29: No. 3, p. 1416 (Aug. 1986).

Johnson et al., "Hydrogen–Induced Platelets in Silicon: Separation of Nucleation and Growth," *Mtrls. Sci. Forum*, 83–87:33–38 (1992).

Lee, B.H. et al., "A Novel Pattern Transfer Process for Bonded SOI Giga–bit DRAMS," *1996 IEEE Int'l. SOI Conference Proceedings, IEEE Electron Devices Society*, (1996.).

Li, J., "Novel Semiconductor Substrate Formed by Hydrogen Ion Implantation into Silicon," *Appl. Phys. Lett.*, 55(21):2223–2224 (1989).

Lu, X. et al., "SOI Material Technology Using Plasma Immersion Ion Implantation," *Proceedings 1996 IEEE International SOI Conference* (Oct. 1996).

Matsuda et al., "Large Diameter Ion Beam Implantation System," *Nuclear Instruments and Methods*, B21:314–316 (1987).

Milnes et al., "Peeled Film Technology for solar Cells," pp. 338–341.

Moreau, Wayne M., *Semiconductor Lithography, Principles, Practices, and Materials*, Plenum Press (1988).

Oshima et al., "Defects in Si irradiated with D–T neutrons, D and He ions," *J. Nuc. Mtrls.*, 179–181:947–950 (1991).

*Patent Abstracts of Japan*, vol. 7, No. 107 (E–174), (May 11, 1993) JP–58–030145 (Feb. 22, 1983).

Picraux, S. Thomas et al., "Ion Implantation of Surfaces," *Scientific American*, 252(3):102–113 (1985).

Renier, M. et al., "A New Low–Energy Ion Implanter for Bombardment of Cylindrical Surfaces," *Vacuum*, 35(12):577–578 (1985).

Sioshansi, Piran, "Ion Beam Modification of Materials for Industry," *Thin Solid Film*, 118:61–71 (1984).

Wolf, Stanley Ph.D., *Silicon Processing for the VLSI Era* vol. 2, pp. 66–79, Lattice Press (1990).

U.S. Dept. of Energy, "The Fusion Connection: . . . ", *Plasma Coating*, pp. 6–7 (1985).

Veldkamp, W.B. et al., Binary Optics, *Scientific American*, pp. 50–55 (May 1992).

\* cited by examiner

PRE-SEMICONDUCTOR PROCESS IMPLANT AND POST-PROCESS FILM SEPARATION

CROSS-REFERENCES TO RELATED APPLICATIONS

This application claims priority to U.S. Provisional Application No. 60/090,387 filed Jun. 23, 1998, hereby incorporated by reference for all purposes.

The following three commonly-owned co-pending applications, including this one, are being filed concurrently and the other two are hereby incorporated by reference in their entirety for all purposes:

1. U.S. patent application Ser. No. 09/335,222, Francois J. Henley and Nathan W. Cheung, entitled, "Pre-Semiconductor Process Implant and Post-Process Film Separation,";
2. U.S. patent application Ser. No. 09/335,221, Francois J. Henley and Nathan W. Cheung, entitled, "A Controlled Cleavage Process and Device for Patterned Films Using Patterned Implants,"; and
3. U.S. patent application Ser. No. 09/335,860, Francois J. Henley and Nathan W. Cheung, entitled, "A Controlled Cleavage Process and Device for Patterned Films Using a Rlease Layer,".

BACKGROUND OF THE INVENTION

The present invention relates to the manufacture of substrates. More particularly, the invention provides a technique including a method and device for cleaving a substrate in the fabrication of a multi-layered substrate for semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microclectromechanical systems ("MEMS"), sensors, actuators, solar cells, flat panel displays (e.g., LCD, AMLCD), biological and biomedical devices, and the like.

Craftsmen or more properly crafts-people have been building useftil articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures such as a glass plate, a diamond, a semiconductor substrate, and others.

These substrate structures are often cleaved or separated using a variety of techniques. In some cases, the substrates can be cleaved using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and/or brittle materials such as diamond or glass.

Accordingly, techniques have been developed to separate these hard and/or brittle materials using cleaving approaches. In diamond cutting, for example, an intense directional thermal/mechanical impulse is directed preferentially along a crystallographic plane of a diamond material. This thermal/mechanical impulse generally causes a cleave front to propagate along major crystallographic planes, where cleaving occurs when an energy level from the thermal/mechanical impulse exceeds the fracture energy level along the chosen crystallographic plane.

In glass cutting, a scribe line using a tool is often impressed in a preferred direction on the glass material, which is generally amorphous in character. The scribe line causes a higher stress area surrounding the amorphous glass material. Mechanical force is placed on each side of the scribe line, which increases stress along the scribe line until the glass material fractures, preferably along the scribe line. This fracture completes the cleaving process of the glass, which can be used in a variety of applications including households.

Although the techniques described above are satisfactory, for the most part, as applied to cutting diamonds or household glass, they have severe limitations in the fabrication of small complex structures or precision workpieces. For instance, the above techniques are often "rough" and cannot be used with great precision in fabrication of small and delicate machine tools, electronic devices, or the like. Additionally, the above techniques may be useful for separating one large plane of glass from another, but are often ineffective for splitting off, shaving, or stripping a thin film of material from a larger substrate. Furthermore, the above techniques may often cause more than one cleave front, which join along slightly different planes, which is highly undesirable for precision cutting applications.

From the above, it is seen that a technique for separating a thin film of material from a substrate which is cost effective and efficient is often desirable.

SUMMARY OF THE INVENTION

According to the present invention, an improved technique for removing a thin film of material including devices (e.g., transistors, capacitors, resistors, inductors) from a substrate using a controlled cleaving action is provided. This technique allows an initiation of a cleaving process on a substrate using a single or multiple cleave region(s) through the use of controlled energy (e.g., spatial distribution) and selected conditions to allow an initiation of a cleave front(s) and to allow it to propagate through the substrate to remove a thin film of material from the substrate.

In a specific embodiment, the present invention provides a process for forming a novel substrate material. The substrate material is generally a blank wafer or donor wafer without any active devices thereon. The substrate material is implanted using a plurality of particles. That is, the process includes a step of introducing energetic particles (e.g., charged or neutral molecules, atoms, or electrons having sufficient kinetic energy) through a surface of a donor substrate to a selected depth underneath the surface, where the particles are at a relatively high concentration to define a thickness of donor substrate material (e.g., thin film of detachable material) above the selected depth. The implanted substrate is a patterned implant, which can be used in a subsequent separation process. Alternatively, the present process includes forming a stressed region on the donor substrate at a selected depth underneath a surface of the substrate, where a thickness of donor substrate material (e.g., thin film of detachable material) above the selected depth is defined. Before separation, however, the substrate is processed using conventional semiconductor process steps including those requiring high temperatures to form active devices on the substrate. After the active devices are formed, the film of material having devices from the donor substrate is separated using a controlled cleaving process. To cleave the donor substrate material, energy is applied to a selected region of the donor substrate to initiate a controlled cleaving action in the donor substrate, whereupon the cleaving action is made using a propagating cleave front(s) to free the donor material from a remaining portion of the donor substrate.

In an alternative specific embodiment, the present invention provides a novel substrate material, which is implanted before semiconductor processing to fabricate devices. The present substrate has a plurality of particles defined in a pattern in the substrate at a selected depth underneath the surface of the substrate. The particles are at a concentration at the selected depth to define a substrate material to be removed in a later cleaving process above the selected depth. The substrate material is removed after forming active devices on the substrate material using, for example, conventional semiconductor processing techniques. The pattern is defined in a manner to substantially prevent a possibility of detachment of the substrate material to be removed during conventional thermal processes of greater than about room temperature or greater than about 200 degrees Celsius or greater than about 400 degrees Celsius. The substrate is cleaved using, for example, a controlled cleaving process by way of a pressurized fluid or the like, which will be described in more detail below. Alternatively, the process includes forming a stressed region in the substrate material at a selected depth underneath a surface of the substrate, where a thickness of donor substrate material (e.g., thin film of detachable material) above the selected depth is defined for separation.

In most of the embodiments, a cleave is initiated by subjecting the material with sufficient energy to fracture the material in one region, causing a cleave front, without uncontrolled shattering or cracking. The cleave front formation energy ($E_c$) must often be made lower than the bulk material fracture energy ($E_{mat}$) at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy ($E_p$). The relationship can be expressed as:

$$E_c = E_p + [\text{cleave front stress energy}]$$

A controlled cleaving process is realized by reducing $E_p$ along a favored direction(s) above all others and limiting the available energy to be below the $E_p$ of other undesired directions. In any cleave process, a better cleave surface finish occurs when the leave process occurs through only one expanding cleave front, although multiple cleave fronts do work.

Numerous benefits are achieved over pre-existing techniques using the present invention. In particular, the present invention uses controlled energy and selected conditions to preferentially cleave a thin film of material from a donor substrate which includes multi-material sandwiched films. This cleaving process selectively removes the thin film of material from the substrate while preventing a possibility of damage to the film or a remaining portion of the substrate. Accordingly, the remaining substrate portion can be re-used repeatedly for other applications.

Additionally, the present invention uses a relatively low temperature during the controlled cleaving process of the thin film to reduce temperature excursions of the separated film, donor substrate, or multi-material films according to other embodiments. In most cases, the controlled cleaving process can occur at, for example, room temperature, as well as others. This lower temperature approach allows for more material and process latitude such as, for example, cleaving and bonding of materials having substantially different thermal expansion coefficients. In other embodiments, the present invention limits energy or stress in the substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, the present invention reduces damage caused by higher than necessary stress or pressure effects and nucleation sites caused by the energetic particles as compared to preexisting techniques.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENTS

The present invention provides a technique for removing a thin film of material from a substrate while preventing a possibility of damage to the thin material film and/or a remaining portion of the substrate. The thin film of material is attached to or can be attached to a target substrate to form, for example, a silicon-on-insulator wafer. The thin film of material can also be used for a variety of other applications. The invention will be better understood by reference to the Figures and the descriptions below.

1. Controlled Cleaving Techniques

Figure 1:
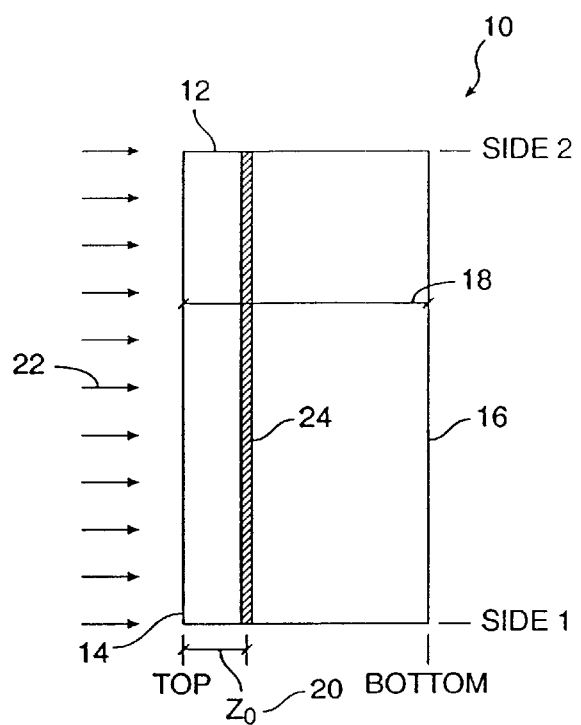
FIGS. 1–11 are simplified diagrams illustrating a controlled cleaving technique according to an embodiment of the present invention.

FIG. 1 is a simplified cross-sectional view diagram of a substrate 10 according to the present invention. The diagram is merely an illustration and should not limit the scope of the claims herein. As merely an example, substrate 10 is a silicon wafer which includes a material region 12 to be removed, which is a thin relatively uniform film derived from the substrate material. The silicon wafer 10 includes a top surface 14, a bottom surface 16, and a thickness 18. Substrate 10 also has a first side (side 1) and a second side (side 2) (which are also referenced below in the Figures). Material region 12 also includes a thickness 20, within the thickness 18 of the silicon wafer. The present invention provides a novel technique for removing the material region 12 using the following sequence of steps.

Selected energetic particles implant 22 through the top surface 14 of the silicon wafer to a selected depth 24, which defines the thickness 20 of the material region 12, termed the thin film of material. A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Examples of plasma immersion implantation techniques are described in "Recent Applications of Plasma Immersion Ion Implantation," Paul K. Chu, Chung Chan, and Nathan W. Cheung, SEMICONDUCTOR INTERNATIONAL, pp. 165–172, June 1996, and "Plasma Immersion Ion Implantation—A Fledgling Technique for Semiconductor Processing,", P. K. Chu, S. Qin, C. Chan, N. W. Cheung, and L. A. Larson, MATERIAL SCIENCE AND ENGINEERING REPORTS, A Review Journal, pp. 207–280, Volume R17, Nos. 6–7, (Nov. 30, 1996), which are both hereby incorporated by reference for all purposes. Other non-mass separated processes such as ion shower or the like can also be used. Of course, techniques used depend upon the application.

Depending upon the application, smaller mass particles are generally selected to reduce a possibility of damage to the material region 12. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes (e.g., deuterium), rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −200 to about 600° C., and is preferably less than about 400° C. to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can be repaired by subsequent heat treatment, e.g., thermal annealing or rapid thermal annealing.

Figure 2:
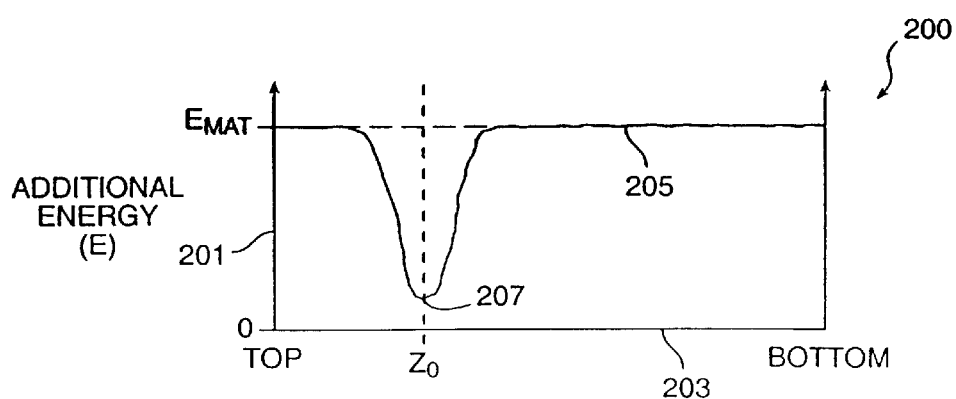

FIG. 2 is a simplified energy diagram 200 along a cross-section of the implanted substrate 10 according to the present invention. The diagram is merely an illustration and should not limit the scope of the claims herein. The simplified diagram includes a vertical axis 201 that represents an energy level (E) (or additional energy) to cause a cleave in the substrate. A horizontal axis 203 represents a depth or distance from the bottom of the wafer to the top of the wafer. After implanting particles into the wafer, the substrate has an average cleave energy represented as E 205, which is the amount of energy needed to cleave the wafer along various cross-sectional regions along the wafer depth. The cleave energy ($E_c$) is equal to the bulk material fracture energy ($E_{mat}$) in non-implanted regions. At the selected depth 20, energy ($E_{cz}$) 207 is lower since the implanted particles essentially break or weaken bonds in the crystalline structure (or increase stress caused by a presence of particles also contributing to lower energy ($E_{cz}$) 207 of the substrate) to lower the amount of energy needed to cleave the substrate at the selected depth. The present invention takes advantage of the lower energy (or increased stress) at the selected depth to cleave the thin film in a controlled manler.

Figure 3:
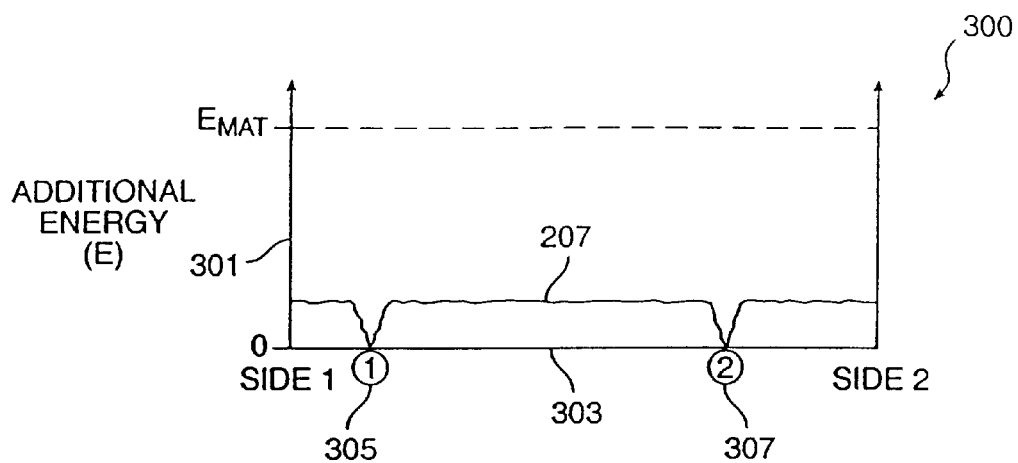

Substrates, however, are not generally free from defects or "weak" regions across the possible cleave front or selected depth $z_0$ after the implantation process. In these cases, the cleave generally cannot be controlled, since they are subject to random variations such as bulk material non-uniformities, built-in stresses, defects, and the like. FIG. 3 is a simplified energy diagram 300 across a cleave front for the implanted substrate 10 having these defects. The diagram 300 is merely an illustration and should not limit the scope of the claims herein. The diagram has a vertical axis 301 which represents additional energy (E) and a horizontal axis 303 which represents a distance from side 1 to side 2 of the substrate, that is, the horizontal axis represents regions along the cleave front of the substrate. As shown, the cleave front has two regions 305 and 307 represented as region 1 and region 2, respectively, which have cleave energies less than the average cleave energy ($E_{cz}$) 207 (possibly due to a higher concentration of defects or the like). Accordingly, it is highly likely that the cleave process begins at one or both of the above regions, since each region has a lower cleave energy than surrounding regions.

Figure 4:
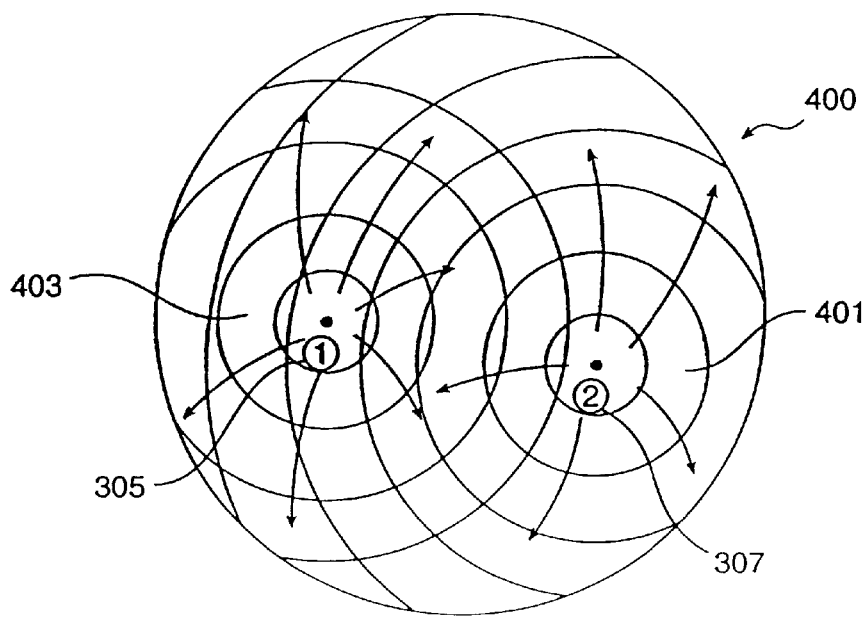

An example of a cleave process for the substrate illustrated by the above Figure is described as follows with reference to FIG. 4. FIG. 4 is a simplified top-view diagram 400 of multiple cleave fronts 401, 403 propagating through the implanted substrate. The cleave fronts originate at "weaker" regions in the cleave plane, which specifically includes regions 1 and 2. The cleave fronts originate and propagate randomly as shown by the arrows. A limitation with the use of random propagation among multiple cleave fronts is the possibility of having different cleave fronts join along slightly different planes or the possibility of forming cracks, which is described in more detail below.

Figure 5:
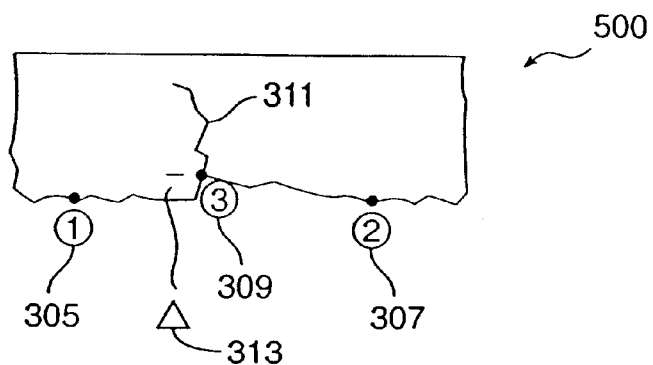

FIG. 5 is a simplified cross-sectional view 500 of a film cleaved from a wafer having multiple cleave fronts at, for example, regions 1 305 and 2 307. This diagram is merely an illustration and should not limit the scope of the claims herein. As shown, the cleave from region 1 joined with the cleave from region 2 at region 3 309, which is defined along slightly different planes, may initiate a secondary cleave or crack 311 along the film. Depending upon the magnitude of the difference 313, the film may not be of sufficient quality for use in manufacture of substrates for integrated circuits or other applications. A substrate having crack 311 generally cannot be used for processing. Accordingly, it is generally undesirable to cleave a wafer using multiple fronts in a random manner. An example of a technique which may form multiple cleave fronts in a random manner is described in U.S. Pat. No. 5,374,564, which is in the name of Michel Bruel ("Bruel"), which is incorporated herein by reference, and assigned to Commissariat A l'Energie Atomique in France. Bruel generally describes a technique for cleaving an implanted wafer by global thermal treatment (i.e., thermally treating the entire plane of the implant) using thermally activated diffusion. Global thermal treatment of the substrate generally causes an initiation of multiple cleave fronts which propagate independently. In general, Bruel discloses a technique for an "uncontrollable" cleaving action by way of initiating and maintaining a cleaving action by a global thermal source, which may produce undesirable results. These undesirable results include potential problems such as an imperfect joining of cleave fronts, an excessively rough surface finish on the surface of the cleaved material since the energy level for maintaining the cleave exceeds the amount required, and many others. Bniel's process also occurs at high temperature that can damage multi-layered substrate structures that include a reflowed glass layer or active devices. The present invention overcomes the formation of random cleave fronts by a controlled distribution or selective positioning of energy on the implanted substrate.

Figure 6:
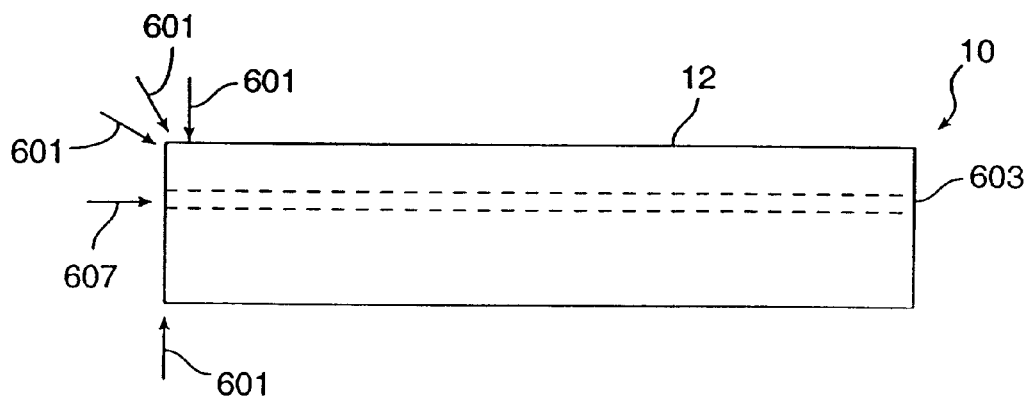

FIG. 6 is a simplified cross-sectional view of an implanted substrate 10 using selective positioning of cleave energy according to the present invention. This diagram is merely an illustration, and should not limit the scope of the claims herein. The implanted wafer undergoes a step of selective energy placement 601 or positioning or targeting which provides a controlled cleaving action of the material region 12 at the selected depth 603. In preferred embodiments, selected energy placement 607 occurs near an edge or corner region of the selected depth 603 of substrate 10. The impulse or impulses are provided using energy sources. Examples of sources include, among others, a chemical source, a mechanical source, an electrical source, and a thermal sink or source. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluidjet, a liquid jet, a gas jet, an electro/magnetic field, an electron beam, a thermo-electric heating, a furnace, and the like. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thennal source is applied as flood, time-varying, spatially varying, or continuous. Still further, any of the above embodiments can be combined or even separated, depending upon the application. Of course, the type of source used depends upon the application.

Figure 6A:
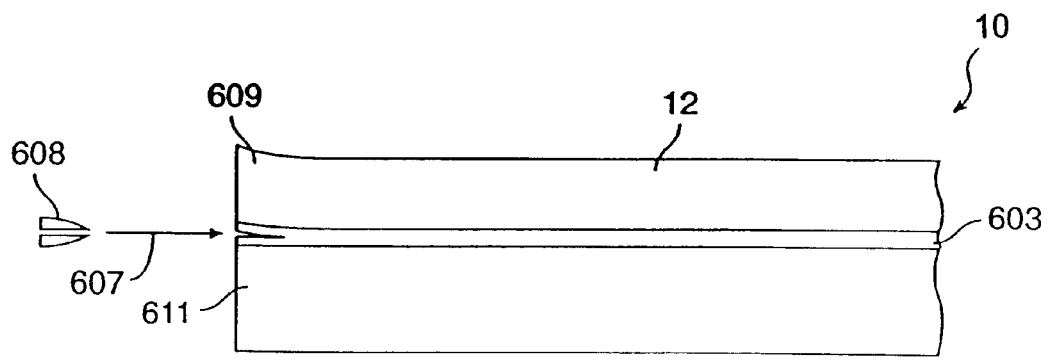

In a specific embodiment, the cncrgy source can be a fluid jet that is pressurized (e.g., compressional) according to an embodiment of the present invention. FIG. 6A shows a simplified cross-sectional view diagram of a fluid jet from a fluid nozzle 608 used to perform the controlled cleaving process according to an embodiment of the present invention. The fluid jet 607 (or liquid jet or gas jet) impinges on an edge region of substrate 10 to initiate the controlled cleaving process. The fluid jet from a compressed or pressurized fluid source is directed to a region at the selected depth 603 to cleave a thickness of material region 12 from substrate 10 using force, e.g., mechanical, chemical, thermal. As shown, the fluid jet separates substrate 10 into two regions, including region 609 and region 611 that separate from each other at selected depth 603. The fluid jet can also be adjusted to initiate and maintain the controlled cleaving process to separate material 12 from substrate 10. Depending upon the application, the fluid jet can be adjusted in direction, location, and magnitude to achieve the desired controlled cleaving process. The fluid jet can be a liquid jet or a gas jet or a combination of liquid and gas.

Figure 6B:
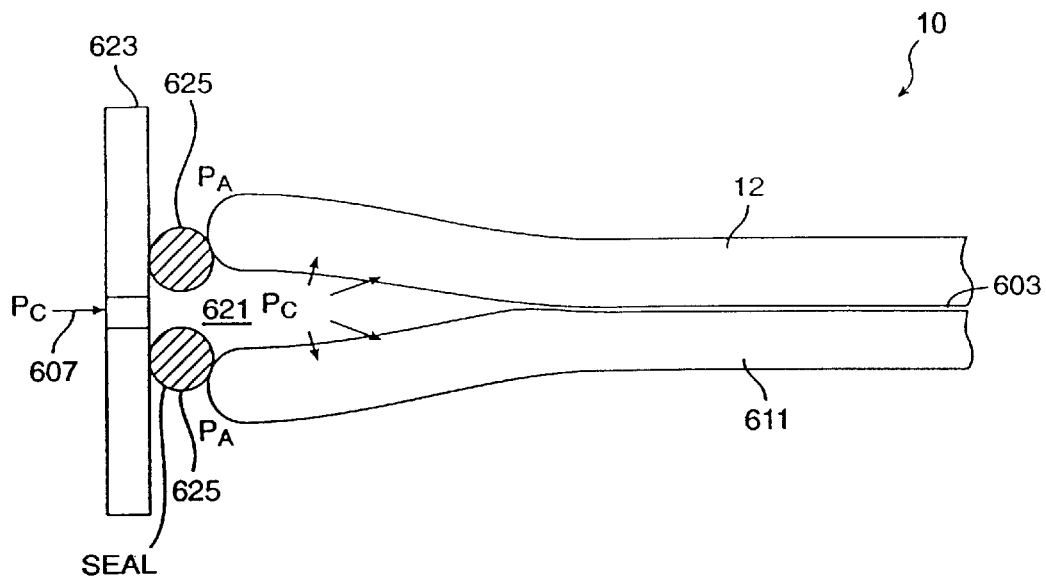

In a preferred embodiment, the energy source can be a compressional source such as, for example, compressed fluid that is static. FIG. 6B shows a simplified cross-sectional view diagram of a compressed fluid source 607 according to an embodiment of the present invention. The compressed fluid source 607 (e.g., pressurized liquid, pressurized gas) is applied to a sealed chamber 621, which surrounds a periphery or edge of the substrate 10. As shown, the chamber is enclosed by device 623, which is sealed by, for example, o-rings 625 or the like, and which surrounds the outer edge of the substrate. The chamber has a pressure maintained at PC that is applied to the edge region of substrate 10 to initiate the controlled cleaving process at the selected depth of implanted material. The outer surface or face of the substrate is maintained at pressure PA which can be ambient pressure e.g., 1 atmosphere or less. A pressure differential exists between the pressure in the chamber, which is higher, and the ambient pressure. The pressure difference applies force to the implanted region at the selected depth 603. The implanted region at the selected depth is structurally weaker than surrounding regions, including any bonded regions. Force is applied via the pressure differential until the controlled cleaving process is initiated. The controlled cleaving process separates the thickness of material 609 from substrate material 611 to split the thickness of material from the substrate material at the selected depth. Additionally, pressure PC forces material region 12 to separate by a "prying action" from substrate material 611. During the cleaving process, the pressure in the chamber can also be adjusted to initiate and maintain the controlled cleaving process to separate material 12 from substrate 10. Depending upon the application, the pressure can be adjusted in magnitude to achieve the desired controlled cleaving process. The fluid pressure can be derived from a liquid or a gas or a combination of liquid and gas.

Figure 7:
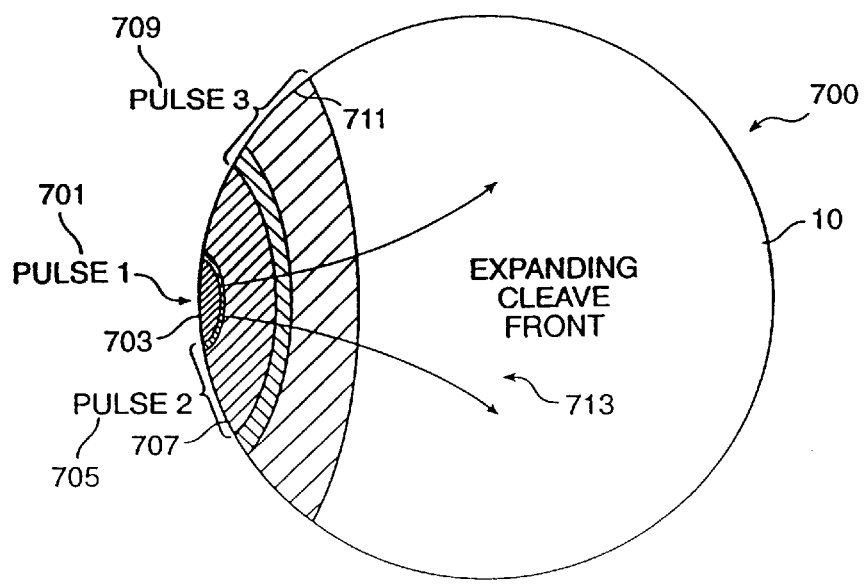

In a specific embodiment, the present invention provides a controlled-propagating cleave. The controlled-propagating cleave uses multiple successive impulses to initiate and perhaps propagate a cleaving process 700, as illustrated by FIG. 7. This diagram is merely an illustration, and should not limit the scope of the claims herein. As shown, the impulse is directed at an edge of the substrate, which propagatcs a cleave front toward the center of the substrate to remove the material layer from the substrate. In this embodiment, a source applies multiple pulses (i.e., pulse 1, 2, and 3) successively to the substrate. Pulse 1 701 is directed to an edge 703 of the substrate to initiate the cleave action. Pulse 2 705 is also directed at the edge 707 on one side of pulse 1 to expand the cleave front. Pulse 3 709 is directed to an opposite edge 711 of pulse 1 along the expanding cleave front to further remove the material layer from the substrate. The combination of these impulses or pulses provides a controlled cleaving action 713 of the material layer from the substrate.

Figure 8:
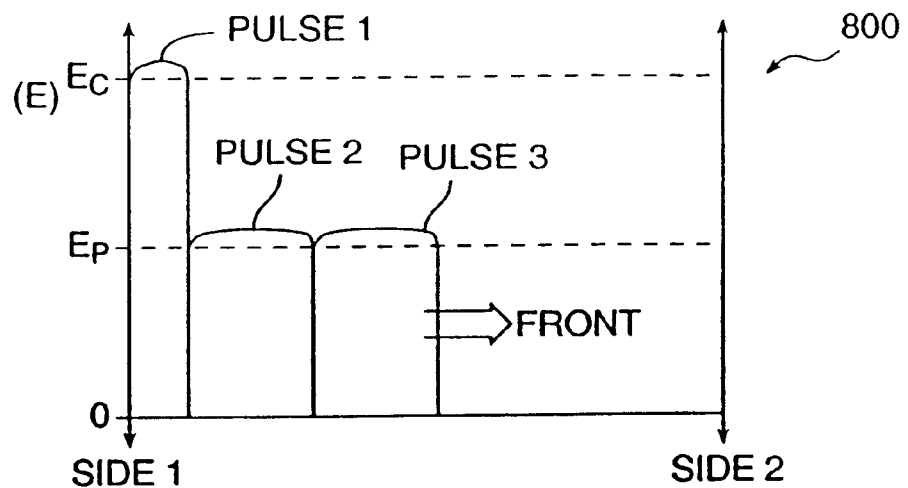

FIG. 8 is a simplified illustration of selected energies 800 from the pulses in the preceding embodiment for the controlled-propagating cleave. This diagram is merely an illustration, and should not limit the scope of the claims herein. As shown, the pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceed cleave energy formation or propagation energies. More preferably, the impinging beam cools and causes a thermal pulse gradient simultaneously, which exceed cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates thi-ough the implanted region of the substrate until the thin film of material is removed. A variety of techniques can be used to initiate the cleave action. These techniques are described by way of the Figures below.

Figure 9:
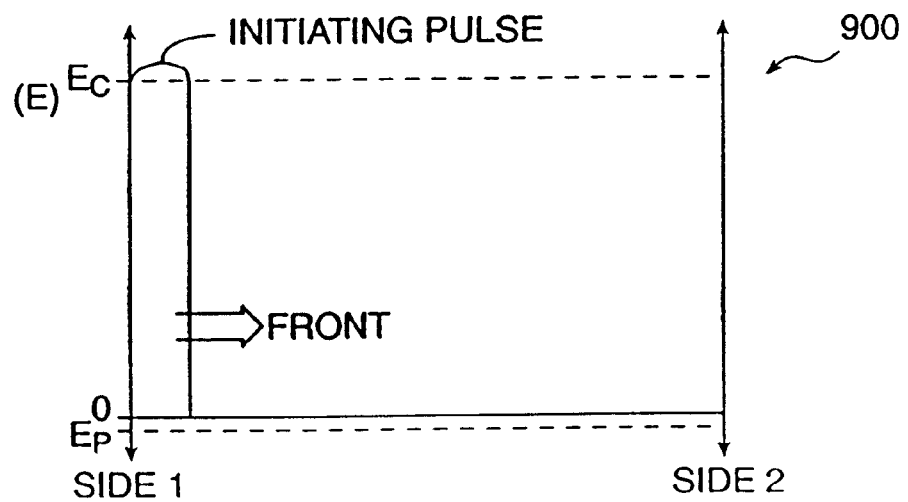

FIG. 9 is a simplified illustration of an energy state 900 for a controlled cleaving action using a single controlled source according to an aspect of the present invention. This diagram is merely an illustration, and should not limit the scope of the claims herein. In this embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

Figure 10:
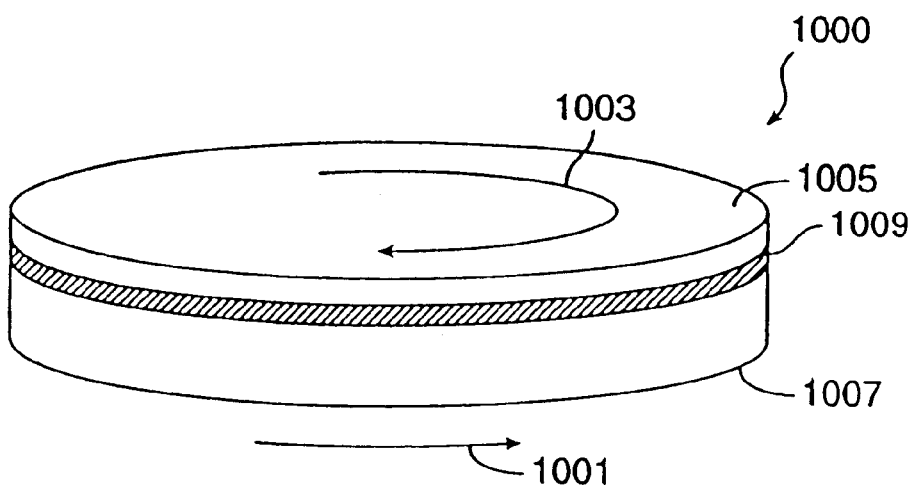
Figure 11:
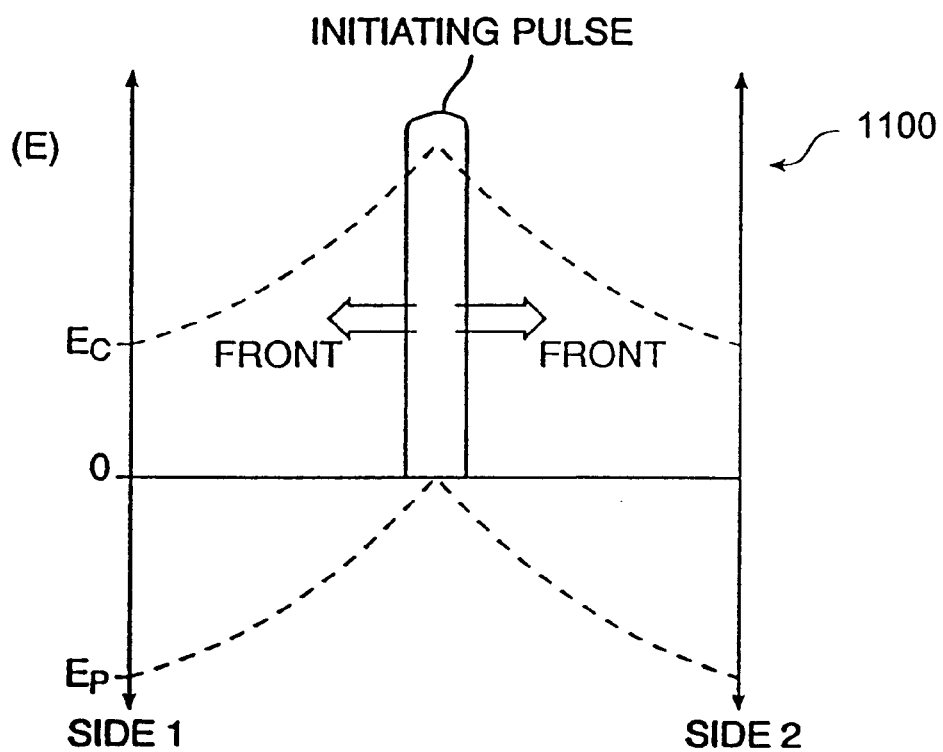

An alternative aspect of the invention is illustrated by FIGS. 10 and 11. FIG. 10 is a simplified illustration of an implanted substrate 1000 undergoing rotational forces 1001, 1003. This diagram is merely an illustration, and should not limit the scope of the claims herein. As shown, the substrate includes a top surface 1005, a bottom surface 1007, and an implanted region 1009 at a selected depth. An energy source increases a global energy level of the substrate using a light beam or heat source to a level above the cleave front propagation energy state, but lower than the energy state necessary to initiate the cleave front. The substrate undergoes a rotational force turning clockwise 1001 on top surface and a rotational force turning counter-clockwise 1003 on the bottom surface which creates stress at the implanted region 1009 to initiate a cleave front. Alternatively, the top surface undergoes a counter-clockwise rotational force and the bottom surface undergoes a clockwise rotational force. Of course, the direction of the force generally does not matter in this embodiment.

FIG. 11 is a simplified diagram of an energy state 1100 for the controlled cleaving action using the rotational force according to the present invention. This diagram is merely an illustration, and should not limit the scope of the claims herein. As previously noted, the energy level or state of the substrate is raised using a global energy source (e.g., thermal, beam) above the cleave front propagation energy state, but is lower than the energy state necessary to initiate the cleave front. To initiate the cleave front, a mechanical energy means such as rotational force applied to the implanted region initiates the cleave front. In particular, rotational force applied to the implanted region of the substrates creates zero stress at the center of the substrate and greatest at the periphery, essentially being proportional to the radius. In this example, the central initiating pulse causes a radially expanding cleave front to cleave the substrate.

The removed material region provides a thin film of silicon material for processing. The silicon material possesses limited surface roughness and desired planarity characteristics for use in a silicon-on-insulator substrate. In certain embodiments, the surface roughness of the detached film has features that are less than about 60 nm, or less than about 40 nm, or less than about 20 nm. Accordingly, the present invention provides thin silicon films which can be smoother and more uniform than pre-existing techniques.

In a preferred embodiment, the present invention is practiced at temperatures that are lower than those used by pre-existing techniques. In particular, the present invention does not require increasing the entire substrate temperature to initiate and sustain the cleaving action as pre-existing techniques. In some embodiments for silicon wafers and hydrogen implants, substrate temperature does not exceed about 400° C. during the cleaving process. Alternatively, substrate temperature does not exceed about 350° C. during the cleaving process. Alternatively, substrate temperature is kept substantially below implanting temperatures via a thermal sink, e.g., cooling fluid, cryogenic fluid. Accordingly, the present invention reduces a possibility of unnecessary damage from an excessive release of energy from random cleave fronts, which generally improves surface quality of a detached film(s) and/or the substrate(s). Accordingly, the present invention provides resulting films on substrates at higher overall yields and quality.

The above embodiments are described in terms of cleaving a thin film of material from a substrate. The substrate, however, can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electro-statics, adhesives, interatomic. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate such as a stiffener or the like before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electro-statics, adhesives, interatomic. Some of these bonding techniques are described herein. The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

2. Patterned Implantation Process

Although the embodiments in this specification are in terms of general implanting techniques, controlled cleaving can be enhanced by way of patterned implanting techniques according to the present invention. Patterned implanting techniques are used to selectively introduce impurities into the substrate using a desired or selected pattern, which enhances the control for the cleaving process. FIGS. 12–20 illustrate a few examples of implanting techniques according to this embodiment of the present invention. These Figures are merely illustrations and should not limit the scope of the claims herein. One of ordinary skill in the art would recognize other variations, alternatives, and modifications.

Figure 12:
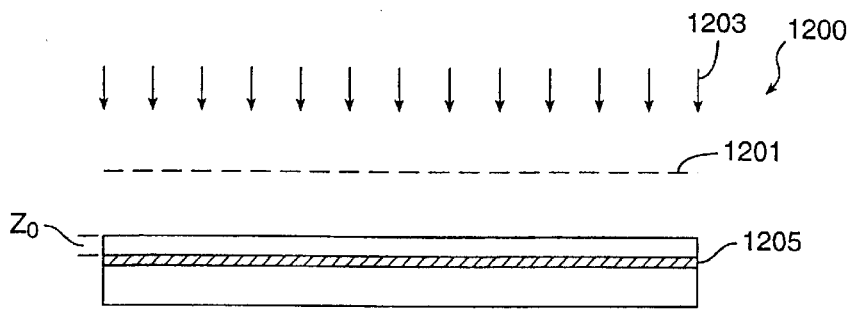
FIGS. 12–20 are simplified diagrams of implanting techniques according to embodiments of the present invention

FIG. 12 is a simplified cross-sectional view diagram 1200 of an implanting step using a patterned mask 1201 according to the present invention. The patterned mask is merely an illustration and should not limit the scope of the claims herein. Patterned mask 1201 is a shadow mask, but also can be others. The patterned implanting step 1203 provides a patterned distribution 1205 of particles at a selected depth ($z_0$). For instance, the patterned mask can be applied directly to the substrate using photolithographic techniques. An example of numerous photographic techniques are described in "Semiconductor Lithography, Principles, Practices, and Materials," Wayne M. Moreau, Plenum Press (1988), which is hereby incorporated by reference for all purposes.

Figure 13:
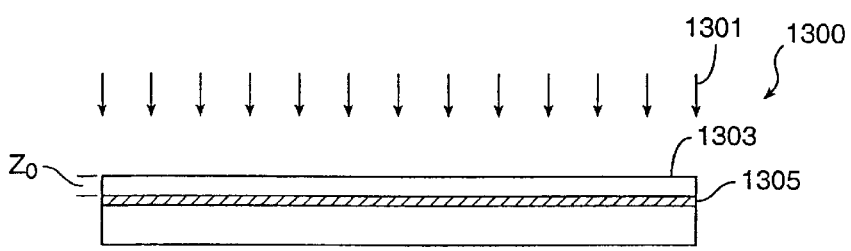
Figure 14:
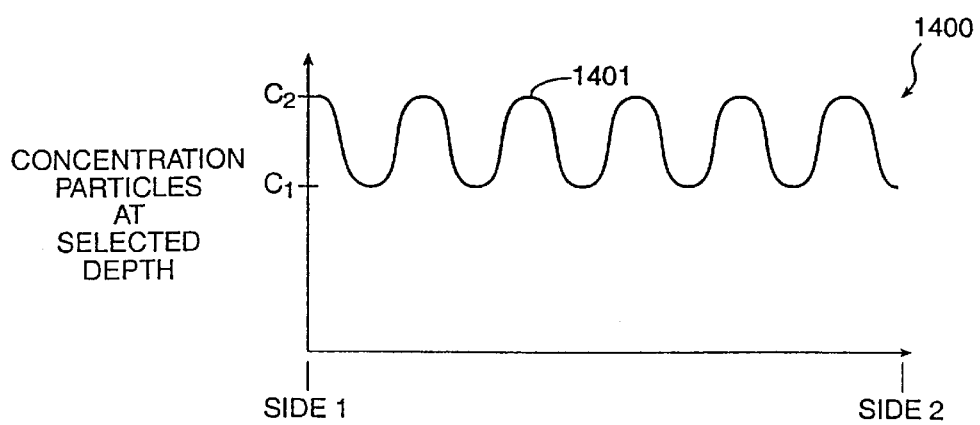

Optionally, the present method uses a blanket implanting step 1300 of the substrate surface after the patterned implanting step described, as illustrated by FIG. 13. The blanket implanting step provides a uniform distribution of particles through the surface of the substrate to a selected depth ($z_0$). An example of a distribution of particles in the substrate after a two-step implanting process using patterned and blanket implanting steps is illustrated by the simplified diagram of FIG. 14. As shown, the diagram 1400 has a vertical axis representing particle concentration at the selected depth ($z_0$), and has a horizontal axis representing distance from side 1 of the substrate to side 2 of the substrate. Using the two-step process described above, which includes a blanket implanting step and a patterned implanting step, concentration distribution 1401 through the cleave plane from side 1 to side 2 of the substrate various periodically and spatially from C1 to C2. Depending upon the technique for cleaving the substrate, various patterns can be used, and are illustrated by FIGS. 15–18.

Figure 15:
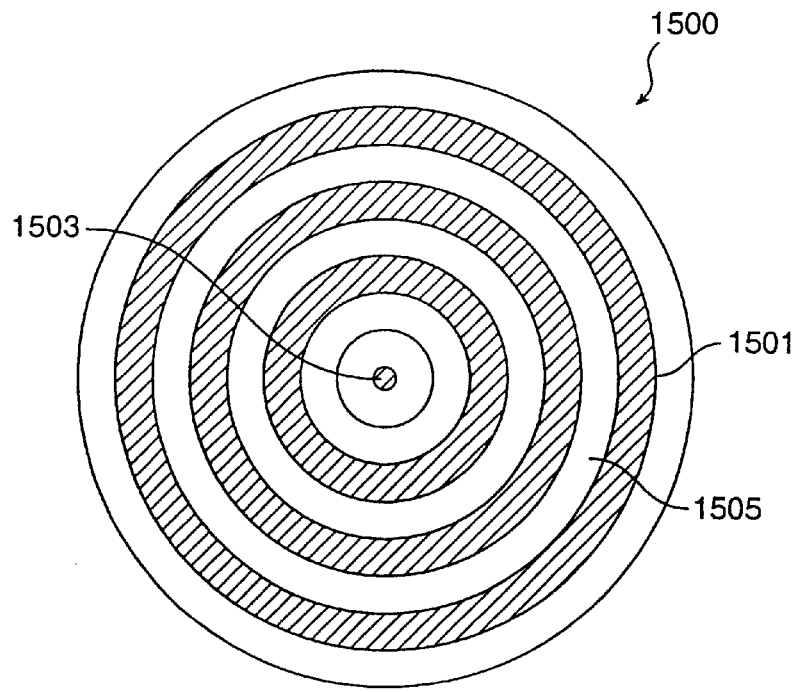

FIG. 15 is a simplified top-view diagram 1500 of an annular distribution of particles according to the present invention. This distribution of particles includes a lower concentration region 1505 and a higher concentration region 1501. The higher concentration region 1501 is defined in concentric annular patterns around a center region 1503 of the substrate. As shown, the annular patterns are defined symmetrically around the center of the substrate and have a plurality of annular regions which are placed next to each other in a constant spatial frequency. The annular patterns tend to enhance the controlled cleaving action according to some embodiments of the present invention.

Figure 16:
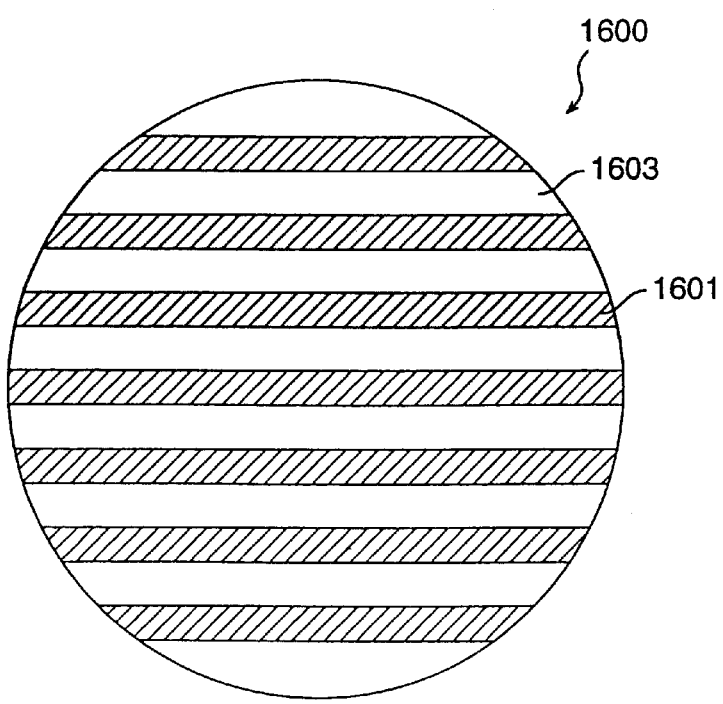

Alternatively, the distribution of particles in the substrate can be in a linear pattern 1600, as illustrated by FIG. 16. As shown, the substrate includes particles having higher and lower concentrations in regions 1601 and 1603, respectively. The linear pattern has regions (i.e., lines) of higher concentration. The regions also have similar widths, but can include other widths. Additionally, the linear pattern has regions (i.e., lines) of lower concentration. The lower concentration regions have similar widths, but also can include other widths. Again, this pattern is likely to enhance the controlled cleaving action according to embodiments of the present invention.

Figure 17:
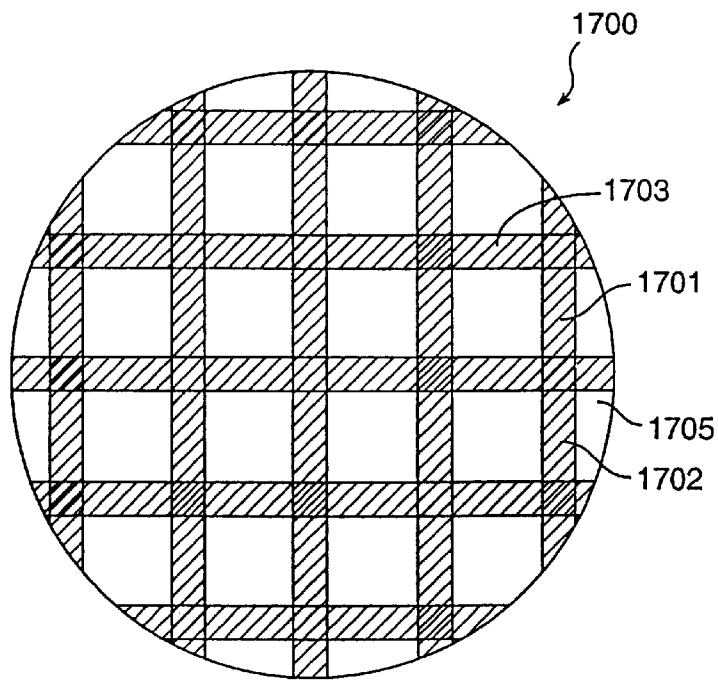

Alternatively, FIG. 17 is a simplified top-view diagram 1700 of a "checker board" pattern of particles according to an alternative aspect of the present invention. The diagram 1700 illustrates a higher concentration region 1701 and a lower concentration region 1705. Higher concentration regions include vertical lines 102 and horizontal lines 1703, which are disposed at a relatively constant spacial frequency. Of course, the use of this pattern will depend upon the particular application.

Figure 18:
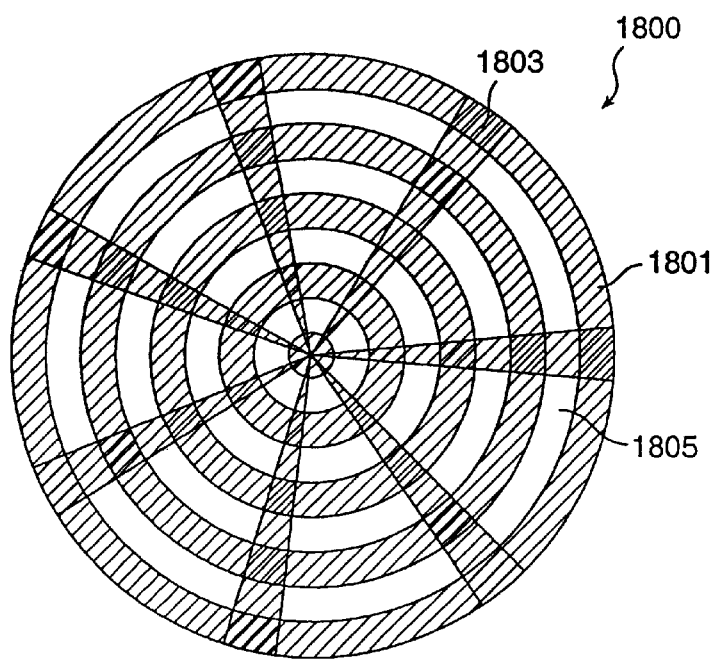

Alternatively, FIG. 18 is a simplified top-view diagram 1800 of a "webbed" or "dart board" pattern of particles according to yet an alternative embodiment of the present invention. This pattern 1800 includes concentric annular regions 1801 of higher concentration, and other higher concentration regions 1803 (i.e, lines) which intersect the annular regions. Lower concentration regions 1805 are also shown. The annular regions have a spatial frequency that is relatively constant, but can also be others, i.e. non-constant. Again, the use of this particular embodiment will depend upon the application.

Figure 19:
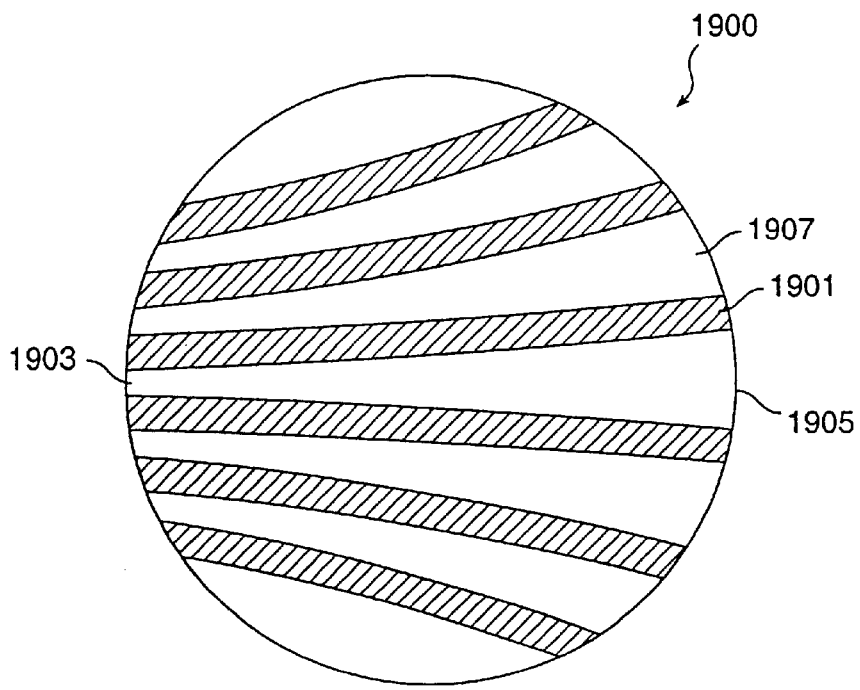
Figure 20:
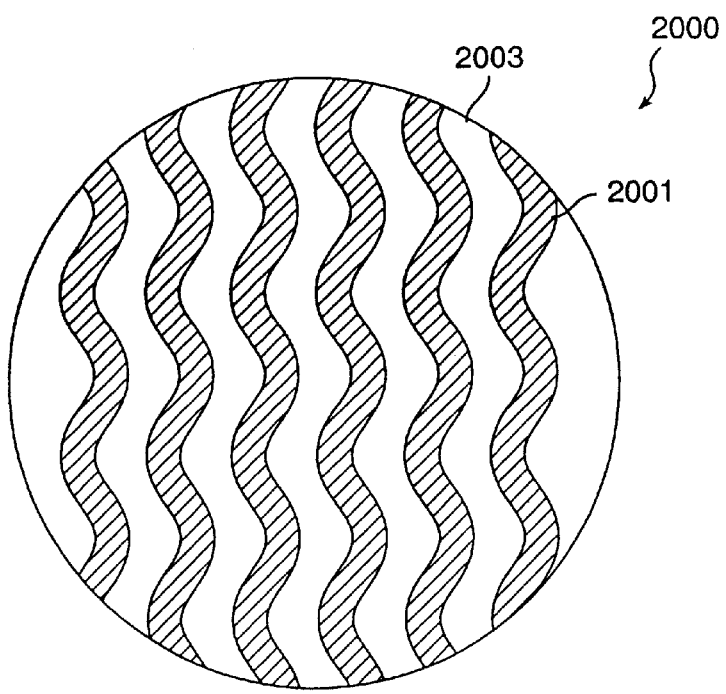

FIGS. 19–20 are simplified top-view diagrams 1900, 2000 of still further particle distributions according to the present invention. These distributions of particles do not have features of constant spatial frequency. In particular, the diagram 1900 of FIG. 19 has a higher concentration region 1901 which has a higher density of particles on one side 1903 of the substrate as compared to the other side 1905 of the substrate. The higher concentration region 1903 includes a plurality of lines, which have different sized widths (but can also be similar). Additionally, lower concentration regions 1905 have a larger spatial distribution on one side 1905 of the substrate as compared to the other side 1903 of the substrate. The higher concentration regions 1901 do not generally run parallel to each other but diverge from each other as they run from one side 1903 of the substrate to the other side 1905 of the substrate. The diagram 2000 of FIG. 20 has a plurality of "wavy" higher concentration regions 2001 that run relatively parallel to each other from one side of the substrate to the other side of the substrate. As shown, the higher concentration regions 2001 are a plurality of wavy lines. These lines each have a relatively similar width, but do not have to. Lower concentration regions 2003 are defined between the higher concentration regions. Depending upon the particular cleaving technique, these patterns can be used.

In a specific embodiment, the patterned implant can also be made in a selected manner to prevent a possibility of detachment during conventional high temperature processes. As merely an example, the patterned implant occurs where at least fifty percent or greater of the exposed surface area of the substrate is substantially free from any implant by way of a protective masking layer. Accordingly, the substrate can be exposed or can undergo conventional semiconductor processing or the like. Separation of the film occurs by adding additional energy to the substrate by way of the present controlled cleaving process to induce the separation process. This separation process generally cannot occur merely by way of thermal treatment.

Although the description above is in terms of a two-step implanting process for creating the distribution of particles in the substrate. The process can be a single step process, as well as multi-step processes using an combination of the above patterns and others. Of course, the particular sequence of implanting steps used depends upon the application.

3. Patterned Film Transfer Process

In a specific embodiment, a process according to the present invention for fabricating the multi-layered structure can be defined as follows:

(1) Provide a donor silicon wafer without any active devices thereon (which may be coated with a dielectric material);

(2) Introduce a selected pattern of particles into the silicon wafer to a selected depth to define a thickness of silicon film;

(3) Anneal the silicon wafer to fix the particles;

(4) Perform conventional device processing on the silicon wafer in the silicon film;

(5) Provide transfer substrate;

(6) Join transfer substrate with the implanted face of the donor silicon wafer;

(7) Increase global stress (or energy) of implanted region at selected depth without initiating a cleaving action (optional);

(8) Provide stress (or energy) to a selected region to initiate a controlled cleaving action at the selected depth;

(9) Provide additional energy to the bonded substrates to sustain the controlled cleaving action to free the thickness of silicon film from the silicon wafer (optional);

(10) Provide a target substrate material (which may be coated with a dielectric material);

(11) Bond the donor silicon wafer to the target substrate material by joining the cleaved face to the target substrate material;

(12) Complete bonding of donor silicon wafer to the target substrate;

(13) Remove transfer wafer from thickness of silicon film on target substrate;

(14) Repeat steps (1) to (13) above to form another layer of active devices on the target substrate material.

The above sequence of steps provides yet a further process for forming a multi-layered substrate. In this process, an implanted substrate is formed, where the implant is made in a pattern. The pattern creates regions where substantially no particles have been implanted, which prevents any detachment of a film of material from the substrate during a conventional thermal process, e.g., annealing. Active devices are formed on the implanted substrate. The active devices are then cleaved from the substrate using a controlled cleaving action by way of a pressurized fluid or the like. Other techniques can also be used to from the active devices from the substrate. These techniques have been described herein, but are not limited. Of course, one or ordinary skill in the art would recognize other variations, modifications, and alternatives.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action.

Further, the above has generally been described in terms of implanting particles to form a cleaving surface. The particles can be replaced by any stressed layer. The stressed layer can be formed by chemical vapor deposition, physical vapor deposition, molecular beam epitaxy, and other techniques to form a multilayered structure, where the stressed layer can be one or more layers and an overlying material layer is a device layer. Here, the final multilayered substrate includes a bulk substrate material, an overlying stressed layer (which can be multiple layers), and an overlying device material layer, e.g., epitaxial layer, molecular beam layer. The device layer is the layer where devices are to be formed using, for example, conventional processes, which may or may not include high temperature processes. An example of such a stressed layer is described in U.S. application Ser. No. 09/313,959, filed May 18, 1999, commonly assigned, and hereby incorporated by reference for all purposes. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A process for forming a film of material comprising devices, said process comprising:

introducing a pattern of particles in a selected manner at a selected depth underneath said surface, said particles being at a concentration at said selected depth to define a substrate material to be removed above said selected depth, said pattern of particles being relatively fixed in said substrate material to prevent a substantial separation of the substrate material during a high temperature process;

forming a plurality of active devices onto said substrate material, said active devices including transistors, said forming including said high temperature process; and providing energy to a selected region of said substrate to initiate a controlled cleaving action at said selected depth in said substrate, whereupon said cleaving action is made using a propagating cleave front to free a portion of said material to be removed from said substrate.

2. The process of claim 1 wherein said particles are selected from the group consisting of neutral molecules, charged molecules, atoms, and electrons.

3. The process of claim 1 further comprising a step of annealing said implanted substrate after said introducing step to fix a relative position of said particles in said substrate.

4. The process of claim 3 wherein said energetic particles have sufficient kinetic energy to penetrate through said surface to said selected depth underneath said surface.

5. The process of claim 1 wherein said step of providing energy sustains said controlled cleaving action to remove said material from said substrate to provide a film of material.

6. The process of claim 1 wherein said step of providing energy increases a controlled stress in said material and sustains said controlled cleaving action to remove said material from said substrate to provide a film of material.

7. The process of claim 1 further comprising a step of providing additional energy to said substrate to sustain said controlled cleaving action to remove said material from said substrate to provide a film of material.

8. The process of claim 1 further comprising a step of providing additional energy to said substrate to increase a controlled stress in said material and to sustain said controlled cleaving action to remove said material from said substrate to provide a film of material.

9. The process of claim 1 wherein said introducing step forms damage selected from the group consisting of atomic bond damage, bond substitution, weakening, and breaking bonds of said substrate at said selected depth.

10. The process of claim 9 wherein said damage causes stress to said substrate material at said selected depth.

11. The process of claim 9 wherein said damage reduces an ability of said substrate material to withstand stress without a possibility of a cleaving of said substrate material.

12. The process of claim 1 wherein said propagating cleave front is selected from a single cleave front or multiple cleave fronts.

13. The process of claim 1 wherein said introducing step causes stress of said material region at said selected depth by a presence of said particles at said selected depth.

14. The process of claim 1 wherein said devices comprise capacitors.

15. The process of claim 1 wherein said devices comprise resistors.

16. The process of claim 1 wherein said devices comprise transistors.

17. The process of claim 1 wherein said energy is provided by a source selected from the group consisting of a thermal source, a thermal sink, a mechanical source, a chemical source, and an electrical source.

18. The process of claim 1 wherein said step of introducing is a step(s) of beam line ion implantation.

19. The process of claim 1 wherein said step of introducing is a step(s) of plasma immersion ion implantation.

20. The process of claim 1 further comprising a step of joining said surface of said substrate to a surface of a target substrate to form a stacked assembly before said providing step.

21. The process of claim 1 wherein said particles comprise hydrogen gas.

22. The process of claim 1 wherein said particles comprise hydrogen compounds.

23. The process of claim 1 wherein said particles comprise deuterium gas.

* * * * *